United States Patent
Norman et al.

(10) Patent No.: US 7,229,498 B2
(45) Date of Patent: Jun. 12, 2007

(54) NANOSTRUCTURES PRODUCED BY PHASE-SEPARATION DURING GROWTH OF $(III-V)_{1-x}(IV_2)_x$ ALLOYS

(75) Inventors: Andrew G. Norman, Evergreen, CO (US); Jerry M. Olson, Lakewood, CO (US)

(73) Assignee: Midwest Research Institute, Kansas City, MO (US)

( * ) Notice: Subject to any disclaimer, the term of this patent is extended or adjusted under 35 U.S.C. 154(b) by 306 days.

(21) Appl. No.: 10/532,540

(22) PCT Filed: Oct. 29, 2002

(86) PCT No.: PCT/US02/34861

§ 371 (c)(1),
(2), (4) Date: Apr. 22, 2005

(87) PCT Pub. No.: WO2004/039731

PCT Pub. Date: May 13, 2004

(65) Prior Publication Data

US 2006/0021564 A1    Feb. 2, 2006

(51) Int. Cl.
*C30B 23/04*    (2006.01)

(52) U.S. Cl. .............. 117/89; 117/90; 117/93; 117/95; 117/102; 117/104; 117/105

(58) Field of Classification Search .......... 117/89, 117/90, 93, 102, 104, 105, 95
See application file for complete search history.

(56) References Cited

U.S. PATENT DOCUMENTS

| | | | |
|---|---|---|---|
| 5,354,707 A | 10/1994 | Chapple-Sokol et al. | |
| 5,585,640 A | 12/1996 | Huston et al. | |
| 5,607,876 A | 3/1997 | Biegelsen et al. | |
| 5,614,435 A | 3/1997 | Petroff et al. | |
| 5,627,382 A | 5/1997 | Canham et al. | |
| 5,690,807 A | 11/1997 | Clark, Jr. et al. | |
| 5,747,180 A | 5/1998 | Miller et al. | |
| 5,804,475 A | 9/1998 | Meyer et al. | |
| 5,830,538 A | 11/1998 | Gates et al. | |
| 5,852,346 A | 12/1998 | Komoda et al. | |
| 6,049,090 A | 4/2000 | Clark, Jr. | |
| 2002/0079485 A1 | 6/2002 | Stintz et al. | |
| 2002/0126536 A1 | 9/2002 | Forbes et al. | |

OTHER PUBLICATIONS

Cirlin et al., Incorporation of InAs nanostrucutres in a silicon matrix: growth, structure and optical properties, Materials Science and Engineering B vol. 80 issues 1-3 Mar. 22, 2001 pp. 108-111.*

(Continued)

*Primary Examiner*—Robert Kunemund
(74) *Attorney, Agent, or Firm*—Paul J. White

(57) ABSTRACT

Nanostructures (18) and methods for production thereof by phase separation during metal organic vapor-phase epitaxy (MOVPE). An embodiment of one of the methods may comprise providing a growth surface in a reaction chamber and introducing a first mixture of precursor materials into the reaction chamber to form a buffer layer (12) thereon. A second mixture of precursor materials may be provided into the reaction chamber to form an active region (14) on the buffer layer (12), wherein the nanostructure (18) is embedded in a matrix (16) in the active region (14). Additional steps are also disclosed for preparing the nanostructure (18) product for various applications.

35 Claims, 8 Drawing Sheets

OTHER PUBLICATIONS

Norman, A.G. et al., "Phase Separation and Facet Formation During the Growth of (GaAs)1-2(Ge2)x Alloy Layers by Metal Organic Vapor Phase Epitaxy," Inst. Phys. Conf. Ser. No. 164, 171 (1999), pp. 171-174.

Norman, A.G. et al., "Ge-related Faceting and Separation During the Growth of Metastable (GaAs)1-2(Ge2)x Alloy Layers by Metal-Organic Vapor Phase Epitaxy," Appl. Phys. Lett. 74, 1382 (1999).

Zakharov, N.D. et al., "Structure and Optical Properties of Si/InAs/Si Layers Grown by Molecular Beam Epitaxy on Si Substrate," Appl. Phys. Lett. vol. 76, No. 19, pp. 2667-2679 (2000).

Heitz, R. et al., "Optical Properties of InAs Quantum Dots in a Si Matrix," Appl. Phys. Lett. 74, 1701 (1999), Physica E7, 317 (2000).

* cited by examiner

US 7,229,498 B2

NANOSTRUCTURES PRODUCED BY PHASE-SEPARATION DURING GROWTH OF $(III-V)_{1-x}(IV_2)_x$ ALLOYS

CONTRACTUAL ORIGIN OF THE INVENTION

The United States Government has rights in this invention under Contract No. DE-AC36-99GO10337 between the United States Department of Energy and the National Renewable Energy Laboratory, operated for the U.S. Department of Energy by Midwest Research Institute, Battelle, Bechtel.

TECHNICAL FIELD

This invention relates to nanostructures and more specifically to nanostructures and methods of production by phase-separation during metal organic vapor-phase epitaxy (MOVPE).

BACKGROUND ART

Nanostructures (i.e., material having sizes that are on the order of a few nanometers) exhibit properties that are intermediate between the properties exhibited by atoms and molecules, and the properties exhibited by bulk solids. These unique properties, or quantum mechanical effects, make nanostructures promising candidates for various optical, optoelectronic, and microelectronic applications.

Nanostructure-based devices are expected to offer improved performance over more conventional devices. For example, indirect band gap semiconductors (e.g., silicon (Si) and germanium (Ge)) typically exhibit extremely low radiative efficiency in bulk materials. However, quantum confinement of the carriers in nanostructures may increase the radiative efficiency and emission energies of these semiconductors. Direct band gap semiconductors (e.g., indium-arsenide (InAs) and indium-phosphide (InP)) are already commonly used in lasers because of their high radiative efficiencies in bulk materials. However, quantum confinement of the carriers in nanostructures may lower threshold current densities and allow for temperature independent energy emission, while also increasing emission energies. These properties may also be fine-tuned by controlling the size of the nanostructures. In addition, with the movement toward smaller, high-bandwidth, low-power interconnects, nanostructures are providing a basis for various optoelectronic applications. For example, nanostructures may be used in optical interconnects for integrated circuits, telecommunications equipment, electronic equipment, etc. Nanostructures may also be used for biological sensors (e.g., capable of connecting with molecules in the human body), and as field emission electron sources (e.g., for flat panel displays), among other applications.

However, before any of these applications can be effectively realized, nanostructures of known size and having a narrow size distribution must be reliably produced. Current methods of fabricating nanostructures are unreliable, producing nanostructures having inconsistent or undesirable properties, and/or are expensive. For example, the Stranski-Krastanov method may be used to produce a coherent strained layer of three-dimensional nanostructure islands. However, the nanostructures are unstable and have varying optical properties. Nanofabrication using lithography and etching to form Si and Ge nanostructures is expensive, and the resulting nanostructures have poor optical properties. Other methods such as laser-assisted catalytic growth of "freestanding" nanowires, and colloidal chemical synthesis both produce nanostructures which are not embedded in a semiconductor material, making these nanostructures less desirable for device applications. Yet other methods for producing nanostructures are also known, such as anodizing and etching to form porous Si containing Si quantum wires, and ion implantation and annealing to form Si or Ge nanocrystals, for example, embedded in a $SiO_2$ matrix.

A need remains for a relatively inexpensive and reproducible method of producing high-quality nanostructures. Additional advantages would be realized if the process were spontaneous, thereby reducing or altogether eliminating manual intervention. Still other advantages would be realized if the method allowed greater control over the growth process, and hence the properties of the resulting nanostructures. Other optical, optoelectronic, and microelectronic applications would also be possible if the nanostructures could be produced from a wide range of materials.

DISCLOSURE OF INVENTION

An embodiment of a method for producing a nanostructure by phase separation during metal organic vapor-phase epitaxy (MOVPE) may comprise the steps of providing a growth surface in a reaction chamber and introducing a first mixture of precursor materials into the reaction chamber to form a buffer layer thereon, providing a second mixture of precursor materials into the reaction chamber to form an active region on the buffer layer, wherein the nanostructure is embedded in a matrix in the active region, and reintroducing the first mixture of precursor materials or a third mixture into the reaction chamber to form a cap layer over the active region.

Another embodiment of a method for producing a nanostructure by phase separation during MOVPE may comprise the steps of providing a growth surface, forming a buffer layer on the growth surface, growing an active region having the nanostructure embedded in a matrix on the buffer layer, and removing a portion of the active region.

Nanostructures (e.g., nanocrystals and nanowires) produced according to the embodiments of the invention are also disclosed.

BRIEF DESCRIPTION OF THE DRAWINGS

Illustrative and presently preferred embodiments of the invention are shown in the accompanying drawings in which.

BEST MODES FOR CARRYING OUT THE INVENTION

Nanostructures and production thereof is shown and described herein according to preferred embodiments of the invention. Briefly, nanostructures may comprise material configured as ultra-fine strands (i.e., "nanowires") or ultra-fine crystals (i.e., "nanocrystals") that are much smaller than the microstructures that are currently produced by conventional microstructure fabrication techniques. Because of their size (i.e., on the order of nanometers), nanostructures exhibit unique properties that make them useful in various optical, optoelectronic, and microelectronic applications, such as in light emitters and detectors, integrated circuits, and flat panel displays to name only a few. Therefore, it is desirable to produce nanostructures of known size and having a narrow size distribution for use in such applications.

Figure 1A:
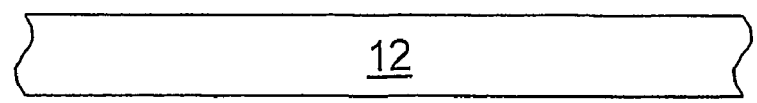
FIG. 1(a) through FIG. 1(c) illustrate an embodiment of nanostructure production by phase separation during metal organic vapor-phase epitaxy (MOVPE), wherein nanocrystals are produced.
Figure 1B:
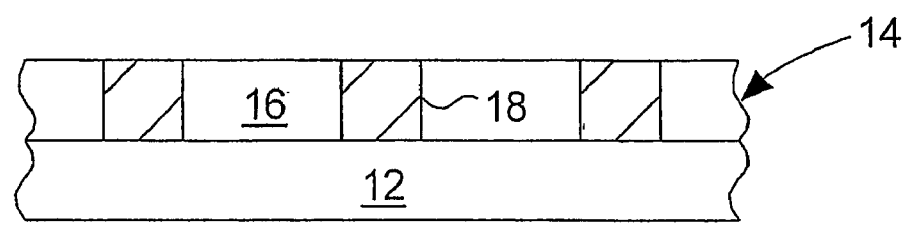
Figure 1C:
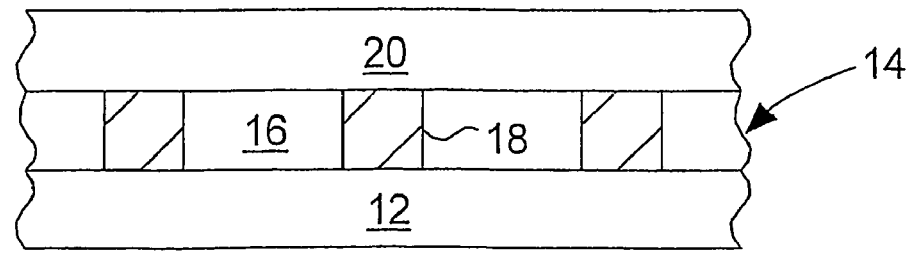
Figure 2A:
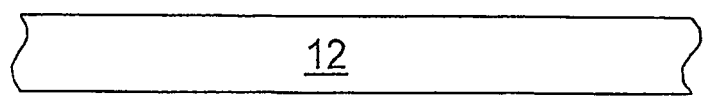
FIG. 2(a) through FIG. 2(c) illustrate another embodiment of nanostructure production by phase separation during MOVPE, wherein nanowires are produced.
Figure 2B:
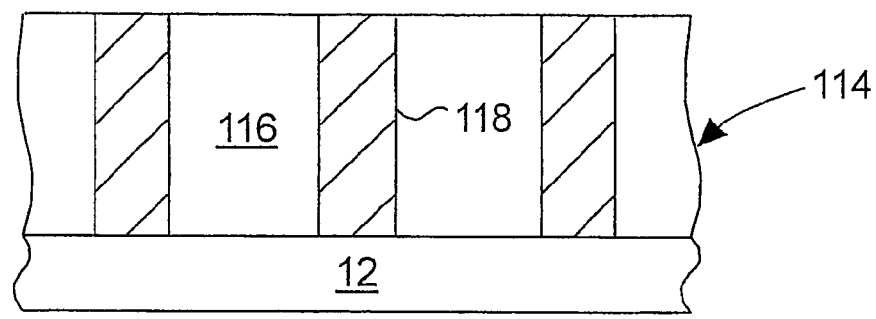
Figure 2C:
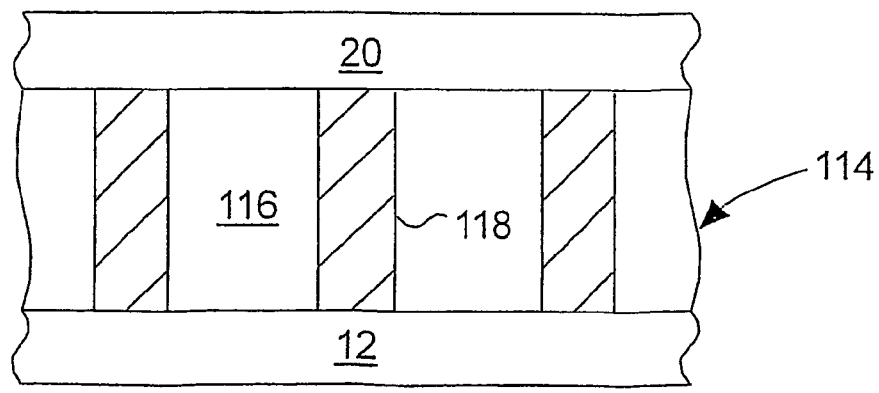

According to embodiments of the invention, nanostructures 18, 118 (e.g., FIG. 1(c) and FIG. 2(c), respectively) may be produced by phase separation during metal organic vapor-phase epitaxy (MOVPE). In one such embodiment, a growth surface may be mounted in a reaction chamber, and a first mixture of precursor materials is introduced into the reaction chamber. The components of the first mixture of precursor materials deposit on the growth surface and form a buffer layer 12 thereon. Once the buffer layer 12 has been grown to the desired thickness, introduction of the first mixture of precursor materials may be discontinued and a second mixture of precursor materials may be introduced into the reaction chamber. The components of the second mixture of precursor materials deposit on the buffer layer 12 and form an active region 14, 114 thereon. As the components of the second mixture of precursor materials deposit on the buffer layer 12, they phase-separate from one another and form distinct nanostructures 18, 118 embedded in a matrix 16, 116 in the active region 14, 114. The active region 14 may be grown for only a short duration, resulting in the formation of "nanocrystals" 18 (i.e., nanostructures less than 20 nm long). Alternatively, the active region 114 may be grown thicker, resulting in the formation of "nanowires" 118 (i.e., nanostructures longer than 20 nm and even as long as one or more microns).

Embodiments of methods for producing nanostructures 18, 118 by phase separation during metal organic vapor-phase epitaxy (MOVPE) may comprise additional steps. For example, after the active region 14, 114 has been grown to the desired thickness, the first mixture of precursor materials may be reintroduced into the reaction chamber to form a cap layer 20 over the active region 14, 114 so that the nanostructure product may be used in various devices or applications (e.g., in semiconductor lasers). In another embodiment, at least a portion of the matrix 116 may be removed from the active region 114 by a selective etching process to expose at least a portion 119 of the nanostructure 118, (FIG. 3(c)) so that the nanostructure product may be used in various other types of devices or applications (e.g., as an electron emitter). In yet other embodiments, at least a portion of the nanostructure 118 may be removed from the active region 114 by another selective etching process to produce a template 22 that can in turn be used to fabricate other nanostructures 218 (FIG. 4(c) and FIG. 4(d)).

A significant advantage of the nanostructures produced according to embodiments of the invention is their high-quality and relative uniformity in size. The process for producing these nanostructures is compatible with known epitaxial growth techniques, and therefore is readily reproducible. In addition, the nanostructures are "self-assembled" during the process and require little, if any, manual intervention. Additional advantages of the invention include the degree of control over the properties of the resulting nanostructures, and the wide range of precursor materials that can be used to produce nanostructures having a wide range of optical, optoelectronic, and microelectronic properties. Yet other advantages will also become apparent with an understanding of the invention.

Having briefly described nanostructures and methods for production thereof, as well as some of the more significant advantages associated therewith, the various embodiments of the present invention will now be described in greater detail below.

Nanostructures may be produced according to an embodiment of the invention by phase separation during metal organic vapor-phase epitaxy (MOVPE). MOVPE is a well-understood and widely used process for "growing" a thin crystalline layer on a substrate material. Generally, the substrate material is provided in a furnace, and various precursor materials are introduced in gaseous form (e.g., using a carrier gas). The components of the precursor materials come into contact with and deposit on the heated substrate material, resulting in the growth of a crystalline layer on the substrate material.

More specifically, MOVPE may be used according to the teachings of the present invention to grow nanostructures on the substrate material as follows. The substrate material (not shown), or growth surface as it is also referred to, may be any suitable material. For example, where gallium arsenide (GaAs) or germanium (Ge) nanostructures are grown on a lattice-matched surface, a gallium arsenide (GaAs) or germanium (Ge) growth surface may be used. Alternatively, where silicon (Si) nanostructures are grown on a lattice-matched surface, a gallium phosphide (GaP) or silicon (Si) growth surface may be used.

In any event, the growth surface may be mounted within the reaction chamber of a furnace (not shown). For example, where a radio frequency (RF) heating element is used, the growth surface may be mounted using a graphite susceptor in the furnace. Alternatively, where infrared (IR) heating is used, the growth surface may be mounted on a metal block in the furnace. The growth surface must be clean and free from defects, since any defects may be reproduced and magnified in the subsequent layers that are grown thereon during the MOVPE process. Therefore, the reaction chamber is typically evacuated to a total pressure of about 50 Torr and the growth surface is cleaned by heating it (e.g., for about 2 minutes at about 700° C.) under flowing hydrogen and an $AsH_3$ over-pressure of about 0.5 Torr before cooling down to the growth temperature.

Following preparation of the growth surface, a first mixture of precursor materials is introduced to the reaction chamber using a carrier gas. As the first mixture of precursor materials passes through the reaction chamber, it is thermally decomposed and deposited on the heated growth surface. These deposits accumulate or "grow" to form a thin coating on the growth surface that is referred to as a buffer layer 12 (e.g., FIG. 1(a)). When the buffer layer 12 is grown to the desired thickness, the introduction of the first mixture of precursor materials is suspended to stop the growth of the buffer layer 12. In its place, a second mixture of precursor materials is introduced to the reaction chamber using a carrier gas. Again, as the second mixture of precursor materials passes through the reaction chamber, it is thermally decomposed and deposited on the buffer layer 12, and grows to form the next layer. This next layer, or the active region 14, 114, is where the nanostructures 18, 118 of the present invention are formed.

According to embodiments of the invention, the nanostructures are formed by phase-separation of the deposited material during growth of the active region 14. That is, the components of the second mixture of precursor materials separate from one another as the second material is deposited in the active region 14 and form distinct nanostructures 18, 118 embedded in a matrix 16, 116. For example, where the components of the second mixture of precursor materials comprise germanium (Ge), gallium (Ga), indium (In), and phosphorus (P), the Ge phase-separates from the GaInP to form Ge nanostructures in a GaInP matrix.

The phase-separation mechanism can be understood as follows with respect to the above example. Although GaInP and Ge are size matched, they are mutually insoluble in the equilibrium bulk solid state, leading to almost complete phase-separation into GaInP and Ge-rich regions at all temperatures below the melting point. The cause of the phase separation is related to the high energy required to form Ga—Ge, In—Ge, and P—Ge bonds, which do not satisfy the octet rule for valence electrons observed in the pure components, and the even higher energies predicted for In—In, P—P, and Ga—Ga anti-site bonds.

Accordingly, as the layer starts growing, the GaInP-rich phase deposits first, with excess Ge segregating to the growing layer surface because the formation of the higher-energy bonds is unfavorable. After the surface Ge concentration reaches a critical value, nucleation of Ge-rich islands occurs on the GaInP growth surface. The excess surface Ge then precipitates out at the Ge-rich islands, because it can now form low-energy Ge—Ge bonds at the Ge-rich nuclei. The GaInP-rich phase between the Ge-rich islands continues to grow and the Ge atoms arriving at the growth surface diffuse to the Ge-rich surface islands and are incorporated there. Repetition of the above growth behavior results in the observed formation of nanostructures during growth of the active region 14.

Once the active region 14, 114 has been grown to the desired thickness, introduction of the second mixture of precursor materials is suspended. For example, where it is desired to produce "nanocrystals," growth of the active region 14 is discontinued after a short duration so that the growth is limited to only nanocrystal-like structures 18 (FIG. 1(b)). Alternatively, where it is desired to produce "nanowires," the growth of the active region 114 continues until a strand-like material 118 (FIG. 2(b)) forms to the desired length.

Nanocrystals 18 may be produced having substantially equal lengths in three dimensions. For example, growth of the active region 14 (i.e., the length of the nanostructure) may be limited to about 20 nm or less. Alternatively, nanowires 118 may be produced having a relatively high length to diameter ratio (i.e., substantially equal in two dimensions and longer in the third dimension). For example, growth of the active region 114 (i.e., the length of the nanostructure) may continue beyond 20 nm and may even be grown as thick as one micron (μm) or more. It is understood, however, that the size of the nanostructures may vary, according to the teachings of the invention, based on design considerations, such as, but not limited to, the intended application or device in which the nanostructures will be used. For example, nanocrystals and/or nanowires may be fabricated for use in the active region of devices, such as light emitting diodes (LEDs), semiconductor lasers, light detectors, transistors, and biological detectors, to name a few.

Production of nanocrystals 18 using phase-separation during MOVPE is illustrated according to one embodiment in FIG. 1(a) through FIG. 1(c). Generally, the buffer layer 12 is grown, as described above and shown in FIG. 1(a). Once the buffer layer 12 is grown to the desired thickness, the active region 14 is grown on the buffer layer 12, again as described above and shown in FIG. 1(b). During growth of the active region 14, phase-separation of the components of the second mixture of precursor materials causes distinct nanostructures 18 to form and become embedded in a matrix 16. Once the active region 14 has been grown to the desired thickness (e.g., the nanocrystals 18 are the desired length), a cap layer 20 may optionally be grown over the active region 14, as shown in FIG. 1(c).

The cap layer 20, or the confining or cladding layer as it is also referred to, may be provided as a protective coating over the active region 14. For example, the cap layer 20 may protect the nanostructures 18 from becoming contaminated with phosphorus as the furnace is cooled after the growth process. In addition, some devices or applications may require confinement of the carriers in the active region (i.e., the nanostructures) therebetween. For example, semiconductor lasers may require the carriers to be "sandwiched" between high band gap layers. Or for example, light emitters may require a coating material having a different refractive index for optical confinement. In any event, the cap layer 20 may be grown using the same method (and material where desired) as was used to grow the buffer layer 12. That is, after growth of the active region 14 is discontinued, the first mixture of precursor materials is again introduced to the reaction chamber (or a third mixture of precursor materials is used). As the first mixture of precursor materials passes through the reaction chamber, deposits accumulate over the active region 14 and form the cap layer 20 thereon.

Production of nanowires 118 is illustrated according to one embodiment of the invention in FIG. 2(a) through FIG. 2(c). The steps are similar to those described above with respect to the production of the nanocrystals 18 and shown in FIG. 1(a) through FIG. 1(c). More specifically, the buffer layer 12 is grown to the desired thickness, as shown in FIG. 2(a). An active region 114 is then grown on the buffer layer 12, as shown in FIG. 2(b). Again, the components of the second mixture of precursor materials phase-separate from one another during growth of the active region 114 to form distinct nanostructures 118 embedded in a matrix 116. In this embodiment, however, the active region 114 continues to grow thicker than the active region 14 where the nanocrystals 18 are produced, resulting in the production of strand-like structures or nanowires 118. Once the active region 114 has been grown to the desired thickness (e.g., the nanowires 118 are the desired size), a cap layer 20 may optionally be grown over the active region 114, as shown in FIG. 2(c).

As an illustration of the production of nanostructures according to the teachings of the invention, germanium (Ge) nanostructures 18, 118 may be produced in a gallium indium phosphide (GaInP) matrix 16, 116 on a gallium arsenide (GaAs) buffer layer 12 as follows. After the growth surface is prepared (e.g., by heating it in the reaction chamber as discussed above), the first mixture of precursor materials is introduced to the reaction chamber using a suitable carrier gas. For example, the first mixture of precursor materials may comprise a gallium source such as triethyl-or trimethyl-gallium (TEG or TMG), and an arsenic source such as arsine ($AsH_3$), and it may be introduced to the reaction chamber using hydrogen gas as the carrier gas. As the mixture of precursor materials passes through the reaction chamber over the heated substrate, gallium arsenide (GaAs) is deposited on the growth surface and forms a GaAs buffer layer 12. When the buffer layer 12 is grown to the desired thickness, introduction of the first mixture of precursor materials is discontinued, and the second mixture of precursor materials is introduced into the reaction chamber to form the active region 14, 114.

As an example, the second mixture of precursor materials may comprise a gallium source such as TMG, an indium source such as triethyl- or trimethyl-indium (TEI or TMI), a phosphorus source such as phosphine ($PH_3$), and a germanium source such as germane or di-germane. As the second mixture of precursor materials passes through the reaction chamber, germanium (Ge) and gallium indium phosphide (GaInP) are deposited on the buffer layer 12, forming the active region 14, 114 thereon. The Ge and GaInP phase-separate from one another on the buffer layer 12, and form discrete Ge nanostructures 18, 118 embedded in a GaInP matrix 16, 116 in the active region 14, 114. Once the active region 14, 114 is grown to the desired thickness (e.g., to form nanocrystals 18 or nanowires 118), the introduction of the second mixture of precursor materials is discontinued.

Where it is desired to produce a cap layer 20 over the active region 14, 114, the first mixture of precursor materials may again be introduced to the reaction chamber. As the mixture of precursor materials passes through the reaction chamber, gallium arsenide (GaAs), in this example, is deposited on the growth surface and forms a GaAs cap layer 20. Alternatively, a third mixture of precursor materials may be introduced where the cap layer 20 is desired to be made of a different material. In any event, when the cap layer 20 is grown to the desired thickness, introduction of the third mixture of precursor materials is discontinued. The reaction chamber may be cooled, and the nanostructure product removed from the reaction chamber.

It is understood that any precursor materials suitable for use with MOVPE may be used according to the teachings of the invention, and other suitable precursor materials will become apparent to one skilled in the art after having become familiar with the teachings of the invention and may depend at least to some extent on various design considerations. Indeed, where it is desirable to use other materials for the different layers, it is readily apparent that other precursor materials will need to be used. For example, triethyl- or trimethyl-aluminum (TEA or TMA) may be substituted for TMG where an aluminum arsenic buffer layer is desired. The invention therefore contemplates an active region 14, 114 characterized by the generic formula (group III-V compound)$_{1-x}$((group IV element or alloy)$_2$)$_x$, wherein the group III-V compound comprises a group III element and a group V element or an alloy comprised of a mixture of several different group III and group V elements.

It should also be noted that other embodiments for producing nanostructures are also contemplated as being within the scope of the invention. For example, when the nanostructures are to be used for device applications (e.g., in solid state electronics), p/n junctions may be required. Briefly, when p-type and n-type materials are placed in contact with one another, current flows readily in one direction (i.e., from one material to the other) but not in the opposite direction (e.g., creating a basic diode). Where it is desired to grow n-type and/or p-type layers, the precursor material is doped (e.g., with Zinc (Zn) to form a p-type layer or with Silicon (Si) to form an n-type layer). Accordingly, these p/n junctions can be formed by growing the active region 14, 114 on an n-type buffer layer 12, and then growing a p-type cap layer 20 over the active region 14, 114. Alternatively, the active region 14, 114 may be grown on a p-type buffer layer 12, and then an n-type cap layer 20 may be grown over the active region 14, 114.

As the size of the nanostructures is controlled by kinetic factors, the size of the nanostructures produced according to the teachings of the invention may be controlled by adjusting various growth parameters, such as the reaction temperature, the growth rate (i.e., the rate at which the precursor material is supplied to the growth chamber), the V/III ratio, etc., or a combination thereof. For example, increasing the growth temperature causes the nanostructures to be formed with a larger diameter. Likewise, decreasing the growth temperature causes the nanostructures to be formed with a smaller diameter. In addition, varying the concentration of the precursor materials results in nanostructures of various sizes and densities. The V/II ratio used during growth may also affect the density and other properties of the nanostructures. The reactor pressure, carrier gas, and type of source materials used during growth may also influence the properties of the nanostructures. Introducing strain between the nanostructure material and the matrix material, and/or between the active layer and substrate material may also be used to affect the size, shape, density, arrangement, electronic and other properties of the nanostructures. The type of substrate material and substrate surface orientation (i.e., growth direction) used for growth may also be used to influence the nanostructure properties such as size, shape, density, arrangement, etc. The addition of one or more surfactants, (e.g., Sb, Bi, etc.) during growth may also be used to affect the properties of the nanostructures such as size, density, etc. Post growth annealing may also be used to control the nanostructure properties.

By controlling the various characteristics of the nanostructures (e.g., size, density, etc.), the properties of the nanostructures may be changed or altered for use in a variety of different applications or devices. For example, by controlling the size of the nanostructures, the band gap of Ge nanostructures may be tuned from 0.7 eV to over 4 eV. This enables light-emitting devices to be fabricated on lattice-matched GaAs and Ge substrates, and may provide an alternative to GaN-based materials for which no suitable lattice-matched substrate exists.

It is also noted that the nanostructure product produced according to the teachings of the invention may be lattice-matched or lattice-mismatched. That is, lattice-matched structures are those in which the constituents (e.g., GaAs and Ge) have the same lattice parameter, even if the crystal structure itself is different for each. For example, the components in $(GaAs)_{1-x}(Ge_2)_x$, $(Ga_{0.52}In_{0.48}P)_{1-x}(Ge_2)_x$, and $(GaP)_{1-x}(Si_2)_x$, are essentially lattice-matched. Alternatively, lattice-mismatched structures are those in which the constituents have different lattice parameters. For example, the components in $(InAs)_{1-x}(Si_2)_x$, $(GaAs)_{1-x}(Si_2)_x$, and $(Ga_{1-y}In_yP)_{1-x}(Si_2)_x$ are essentially lattice-mismatched. Both lattice-matched and lattice-mismatched products exhibit unique characteristics that make each desirable in various applications.

Precursor material having lattice-matched components result in the production of lattice-matched nanostructures. That is, there is no strain between the nanostructures and the surrounding matrix. Accordingly, these nanostructures tend to be more thermally stable than the strained quantum particles produced by the conventional Stranski-Krastanov process. In addition, as the nanostructures in these lattice-matched systems are unstrained with respect to the matrix and also possess a different crystal structure, it is relatively easy to measure their size and shape by electron microscopy. Accordingly, this enhances the ability to determine and control their size, and makes the nanostructures ideal for testing theoretical models of the optical and electronic properties of semiconductor nanostructures.

Even more lattice-mismatched components exist, which may enable a much wider range of optical and electronic properties to be realized from nanostructures formed in the phase-separated material. For example, nanostructures formed of lattice-mismatched components, e.g., $(InAs)_{1-x}(Si_2)_x$, may be used for direct band gap group III-V nanostructures on Si substrates spanning the energy gap range from about 0.4 electron volts (eV) to over 4 eV. This includes the 1.3 to 1.55 μm and visible light wavelength regions. Such Si-based light-emitting devices are of particular importance as optical interconnects on Si-based integrated circuits. Similarly growth of phase-separated $(InAs)_{1-x}(Ge_2)_x$ may enable the fabrication of direct band gap group III-V nanostructure devices on GaAs and Ge substrates spanning the 1.3 to 1.55 μm wavelength region, which is particularly important for optical fiber communication.

Figure 3A:
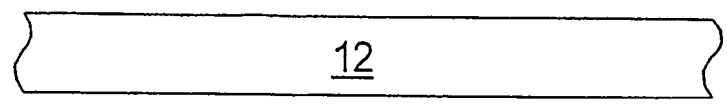
FIG. 3(a) through FIG. 3(c) illustrate yet another embodiment of nanostructure production by phase separation during MOVPE, wherein at least a portion of the matrix is removed.
Figure 3B:
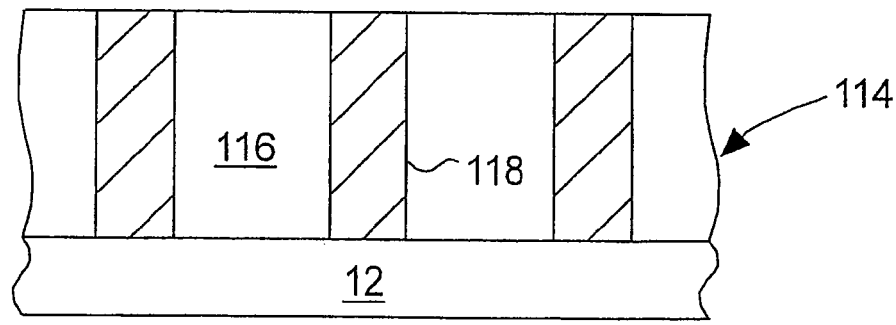
Figure 3C:
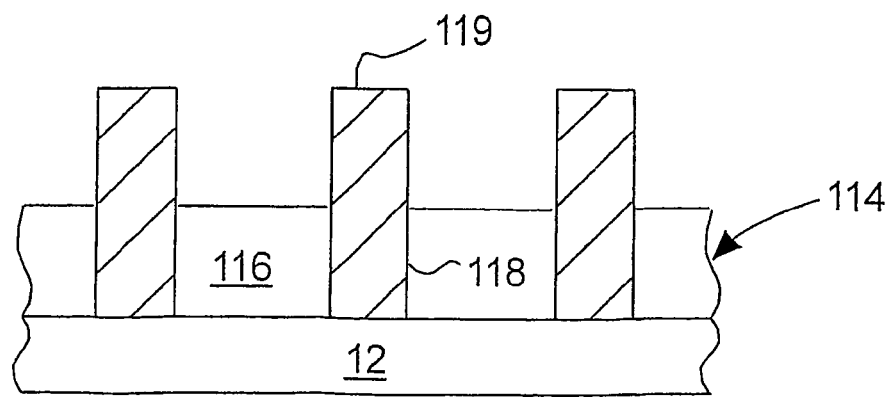

Another embodiment of the invention is illustrated with respect to FIG. 3(a) through FIG. 3(c) in which nanostructures are produced for use as electron emitters. The initial steps shown in FIG. 3(a) and FIG. 3(b), wherein the buffer layer 12 and the active region 114 are grown, are similar to those described above with respect to the production of nanowires 118 (FIG. 2(a) and FIG. 2(b)). That is, the buffer layer 12 is grown to the desired thickness, as shown in FIG. 3(a), followed by the active region 114, as shown in FIG. 3(b). Again, phase-separation of the components of the precursor material during growth of the active region 114 causes the formation of distinct nanostructures 118 embedded in a matrix 116. According to this embodiment, however, once the active region 114 has been grown to the desired thickness (e.g., the nanostructures 118 are the desired size), the growth process is stopped. For example, introduction of the second mixture of precursor materials may be discontinued, the reaction chamber is allowed to cool, and the nanostructure product removed.

According to this embodiment, instead of forming a cap layer 20 on the active region 114, the matrix 116 is removed to expose at least a portion of the nanostructures 118 (e.g., exposed wire 119 in FIG. 3(c)). The matrix 116 may be removed according to any suitable process, such as etching. Etching is a well-known process that uses an etchant (e.g., concentrated hydrochloric acid (HCl)) to selectively target and erode a particular element or compound. According to the invention, the etchant may be introduced to the active area 114, which targets the matrix 116 and erodes at least a portion thereof. However, the etchant does not erode the nanostructures, and thus leaves at least a portion of the nanowires 118 in the active region 114 exposed. Although in the embodiment shown in FIG. 3(c), the matrix 116 is not fully eroded and thus serves to maintain the spacing and alignment of the nanostructures 118, in other embodiments, the matrix 116 may be fully removed to "harvest" individual nanostructures 118. As an example, for the $(Ga_{0.52}In_{0.48}P)_{1-x}(Ge_2)_x$ system concentrated HCl or HCl/$H_2O$ mixtures may be used to selectively target the $Ga_{0.52}In_{0.48}P$ matrix.

Once produced, the array of exposed nanostructures attached to the buffer layer 12 may be used as field emission electron sources. For example, the nanostructures 118 may be placed in a vacuum, and a negative and positive electrode each positioned on opposite sides thereof, wherein electrons are caused to flow from the negative side, through the nanostructures 118 and across the vacuum toward the positive electrode.

Figure 4A:
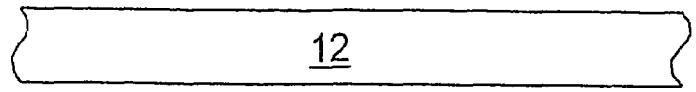
FIG. 4(a) through FIG. 4(d) illustrate still another embodiment of nanostructure production by phase separation during MOVPE, wherein a template for fabricating nanostructures is produced.
Figure 4B:
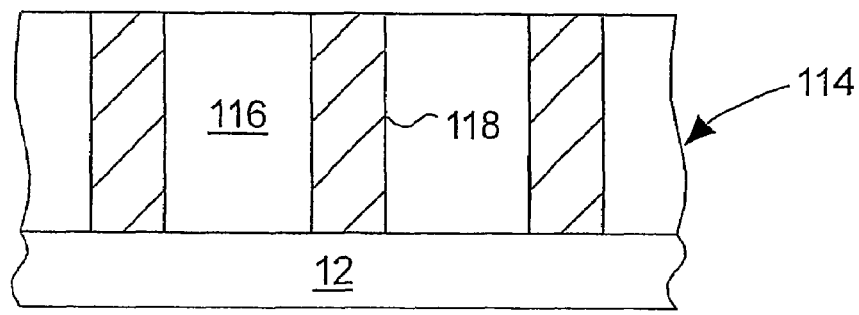
Figure 4C:
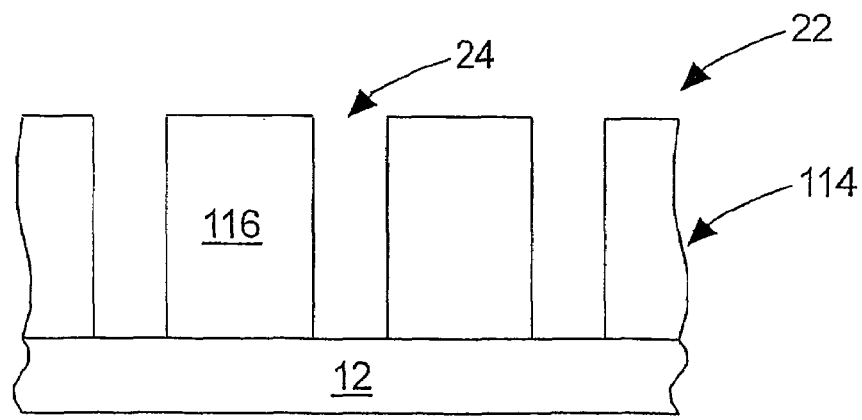
Figure 4D:
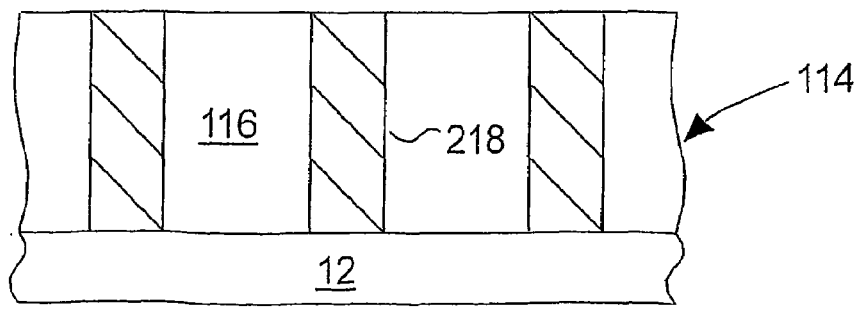

Yet another embodiment of the invention is illustrated with respect to FIG. 4(a) through FIG. 4(d) in which a template is produced for making nanostructures. The initial steps shown in FIG. 4(a) and FIG. 4(b), wherein the buffer layer 12 and the active region 114 are grown, again are similar to those described above with respect to the production of nanowires 118 (FIG. 2(a) and FIG. 2(b)). That is, the buffer layer 12 is grown to the desired thickness, as shown in FIG. 4(a), followed by the active region 114, as shown in FIG. 4(b). Again, phase-separation of the components of the precursor material during growth of the active region 114 causes the formation of distinct nanostructures 118 embedded in a matrix 116. According to this embodiment, however, once the active region 114 has been grown to the desired thickness (e.g., the nanowires 118 are the desired size), the growth process is stopped. For example, introduction of the second mixture of precursor materials may be discontinued, the reaction chamber allowed to cool, and the nanostructure product removed.

Instead of forming a cap layer 20 on the active region 114, at least a portion of the nanostructures 118 are removed according to this embodiment, to form a hole or void 24 in the matrix 116 as shown in FIG. 4(c). The nanostructures 118 may be removed according to any suitable process, such as the etching process described above. However, in this embodiment, an etchant (e.g., $H_2SO_4/H_2O_2/H_2O$) may be introduced to the active area 114, which targets only the nanostructures 118 and erodes at least a portion thereof. The etchant does not erode the matrix 116, and thus forms the voids 24 in the active region 114. For example, for the $(Ga_{0.52}In_{0.48}P)_{1-x}(Ge_2)_x$ system $H_2SO_4/H_2O/H_2O$, $NH_4OH/H_2O_2/H_2O$, and $H_3PO_4/H_2O_2/H_2O$ mixtures may be used to selectively target the Ge nanostructures.

Once produced, the voids 24 formed in the matrix 116 may be used as a template for producing nanostructures 218. That is, the template 22 may be mounted in the reaction chamber of the furnace, and a third mixture of precursor materials having only the components for forming the desired nanostructures 218 may be introduced using a suitable carrier gas. As the precursor material passes over the template 22, the nanostructure component is deposited in the voids 24 of the template 22 to grow the desired nanostructure 218 therein.

As an example of its use, some of the matrix material may be incorporated with the nanostructures that are formed initially during phase-separation. Thus, the "impure" nanostructures 118 may be removed to form template 22, as just explained, and the voids 24 formed in the template 22 may be refilled to fabricate highly-pure nanostructures 218. Optionally in such an embodiment, a portion of the original nanostructure 118 may be left in the voids 24 formed in the template 22 and act as a "seed" to facilitate growth of the pure material therein. The template 22 may also be used where the phase-separation mechanism may not work, or may not work as well, for the components of a precursor material. For example, when the nanostructure product is to be used as a light emitter, the template 22 may be used to fabricate nanostructures 218 from a direct band gap material such as InP, InAs, or GaAs. The template 22 may also be used to fabricate hetero-nanostructures 218 (e.g., Si—Ge nanowires) by alternately filling the template with Si and Ge.

It should be noted that although embodiments of the invention are shown in FIG. 3(a) through FIG. 3(c) and in FIG. 4(a) through FIG. 4(d) for selectively removing either the matrix 116 or the nanostructures 118, wherein the nanostructures are nanowires 118, the invention may also be practiced according to these embodiments wherein the nanostructures are nanocrystals 18. In addition, the buffer layer 12, matrix 16, 116, and nanostructures 18, 118 may be formed using any suitable material according to the teachings of the present invention. It is further contemplated that other embodiments for selectively removing either a portion of the matrix or the nanostructures are also contemplated as being within the scope of the invention, and will occur to those skilled in the art after having become familiar with the teachings of the invention. Consequently, the scope of the invention should not be limited to the selective etching process described herein.

Before continuing with specific examples of the invention, it should be noted that the invention is not limited to the embodiments described and illustrated herein. Other embodiments of the invention are also contemplated as being within the scope of the invention, as will become apparent to one skilled in the art after having become familiar with the teachings of the invention. Likewise, the following examples are provided to illustrate various embodiments of the invention. However, the invention is not to be limited thereto.

EXAMPLES

Nanostructures were produced in the following examples by phase separation during metal organic vapor-phase epitaxy (MOVPE) according to the teachings of the invention. A GaAs crystalline substrate was mounted on a metal block in the reaction chamber of an infrared (IR) heated MOVPE furnace and prepared by evacuating the reaction chamber to a pressure of 50 Torr and heating it for 2 minutes at 700° C. under flowing hydrogen and with an $AsH_3$ over-pressure of about 0.5 Torr.

After the growth surface was prepared, the temperature of the substrate was held at about 643° C., and the pressure of the reactor at about 50 Torr, for the following growth process. A first mixture of precursor materials was introduced to the reaction chamber, using hydrogen gas as the carrier gas, to grow a gallium arsenide (GaAs) buffer layer. The growth rate was about 0.04 µm/min and V/III ratio about 50, and the first precursor material comprised trimethyl-gallium (TMG) as the gallium source, and arsine ($AsH_3$) as the arsenic source. As the precursor material passed over the heated substrate, the gallium and arsenic source materials were thermally decomposed and gallium (Ga) and arsenic (As) were deposited on the GaAs growth surface to form a GaAs buffer layer. When the buffer layer was grown to about 500 nm, introduction of the TMG and arsine was suspended. Accordingly a 500 nm thick buffer layer was grown on the growth surface and provided a foundation for growing the active region.

A second mixture of precursor materials was then introduced to the reaction chamber to grow the active region. The second precursor material comprised trimethyl-gallium (TMG) as the gallium (Ga) source, trimethyl-indium (TMI) as the indium (In) source, phosphine ($PH_3$) as the phosphorus (P) source, and germane as the germanium (Ge) source. Hydrogen was again used as the carrier gas and the V/III ratio was again close to 50. As the second precursor material passed through the reaction chamber, Ga, In, P, and Ge were deposited, at a rate of about 0.08 µm/min, on the GaAs buffer layer and formed the active region. During growth of the active region, phase-separation occurred. That is, the Ge separated from the $Ga_{0.52}In_{0.48}P$ to form Ge nanostructures embedded in a matrix of $Ga_{0.52}In_{0.48}P$. It is believed that the phase-separation mechanism took place as follows. As the layer started growing, the GaInP-rich phase deposited first, with excess Ge segregating to the growing layer surface. After the surface Ge concentration reached a critical value, nucleation of Ge-rich islands occurred on the GaInP growth surface. The excess surface Ge then precipitated out at the Ge-rich islands by forming low-energy Ge—Ge bonds at the Ge-rich nuclei. Both the GaInP-rich matrix and the Ge-rich nanostructures continued to grow, the latter by surface diffusion of Ge atoms from the GaInP-rich matrix, and repetition of the above growth behavior is believed to have resulted in the observed formation of the Ge nanostructures embedded in the GaInP matrix.

In one example, the active region was grown to about 20 nm thick to produce nanocrystals. In another example, the active region was grown to about 1 µm thick to produce nanowires. Once the active region was grown to the desired thickness, introduction of the second precursor material was discontinued. In examples where a cap layer was desired, the first precursor material comprising TMG and arsine was again introduced to the reaction chamber using hydrogen as the carrier gas. In any event, following growth of the nanostructure product, a flow of arsine and hydrogen gas was introduced into the reaction chamber while it was cooled to room temperature. The nanostructure product so produced was a composite semiconductor with Ge nanowires embedded in a $Ga_{0.52}In_{0.48}P$ matrix.

In another example a different second mixture of precursor materials was introduced to the reaction chamber to grow the active region after growth of the GaAs buffer layer. The second mixture of precursor materials comprised trimethyl-gallium (TMG) as the gallium (Ga) source, arsine ($AsH_3$) as the arsenic (As) source, and germane as the germanium (Ge) source. Hydrogen was again used as the carrier gas and the reactor pressure was again 50 Torr. A V/III ratio of about 3 was used. As the second mixture of precursor materials passed through the reaction chamber, Ga, As, and Ge were deposited on the GaAs buffer layer at about 0.09 µm/min and formed the active region. During growth of the active region, phase-separation occurred. That is, the Ge separated from the GaAs to form Ge nanostructures embedded in a matrix of GaAs by the mechanism described above.

In yet another example another different second mixture of precursor materials was introduced to the reaction chamber to grow the active region after growth of the GaAs buffer layer. The second mixture of precursor materials comprised trimethyl-gallium (TMG) as the gallium (Ga) source, trimethyl-aluminum (TMAl) as the aluminum (Al) source, phosphine ($PH_3$) as the phosphorus (P) source, and germane as the germanium (Ge) source. Hydrogen was again used as the carrier gas and the reactor pressure was again 50 Torr. A growth temperature of 619° C. and V/III ratio of about 150 was used. As the second mixture of precursor materials passed through the reaction chamber, Al, In, P, and Ge were deposited, at a rate of about 0.09 μm/min, on the GaAs buffer layer and formed the active region. During growth of the active region, phase-separation occurred. That is, the Ge separated from the $Al_{0.48}In_{0.52}P$ to form Ge nanostructures embedded in a matrix of $Al_{0.48}In_{0.52}P$ by the mechanism described above.

Figure 5:
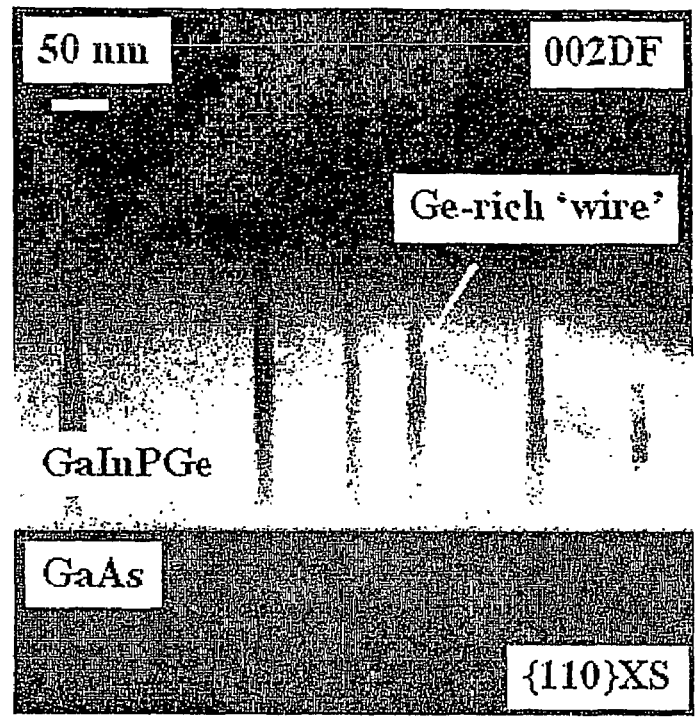
FIG. 5 is a 002 dark field (002 DF) transmission electron microscopy (TEM) image showing a cross-section of nanostructures produced according to an embodiment of the invention.
Figure 6A:
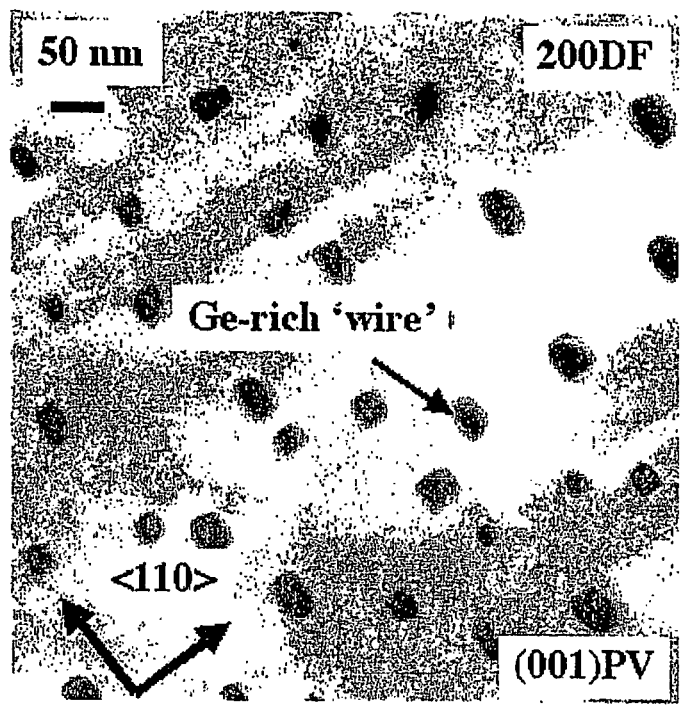
FIG. 6(a) and FIG. 6(b) are 200 DF TEM images showing plan-views of nanostructures produced according to an embodiment of the invention, wherein the alloy composition was changed to control the density of the nanostructures.
Figure 6B:
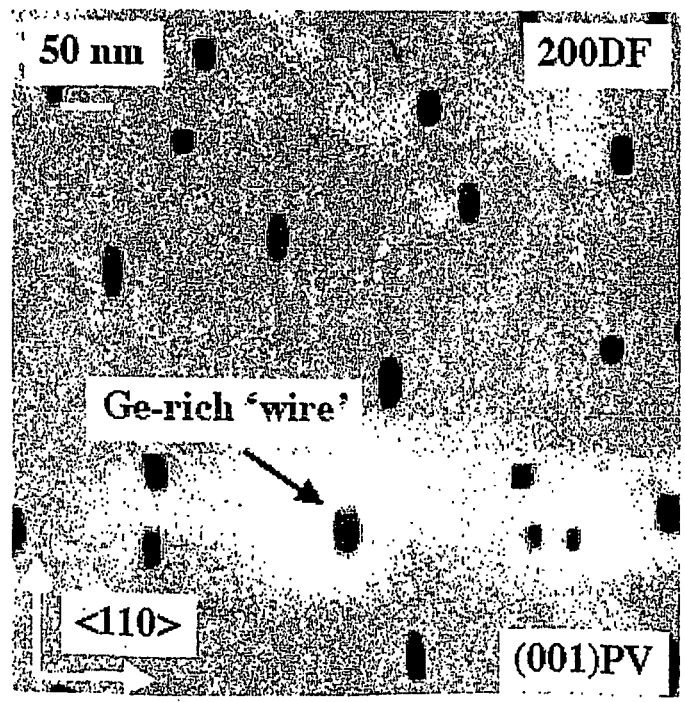

The nanostructure product was imaged using transmission electron microscopy (TEM) The TEM samples were prepared by conventional mechanical and ion-milling techniques and examined using a Philips CM30 transmission electron microscope. TEM images of nanostructures produced by the phase-separation technique are shown in FIG. 5 through FIG. 9. The cross-sectional TEM image of FIG. 5 shows coherent Ge-rich nanowires threading vertically in the [001] growth direction embedded in the GaInP matrix of a phase-separated $(Ga_{0.52}In_{0.48}P)_{0.8}(Ge_2)_{0.2}$ alloy, grown at 643° C. using a V/III ratio of about 50 and at a rate of 0.08 μm/min, on a GaAs buffer layer. FIG. 6(a) shows a plan-view TEM image of the same sample. The Ge nanowires are roughly rectangular in cross-section and in this sample have diameters ranging from about 20 to 50 nm. The edges of the nanowires are aligned roughly parallel to the orthogonal <110> directions. The nanostructures shown in FIG. 5 and FIG. 6(a) have a density of about $9 \times 10^9$ cm$^{-2}$. The nanostructures shown in FIG. 6(b) were formed by phase-separation in a $(Ga_{0.52}In_{0.48}P)_{0.9}(Ge_2)_{0.1}$ alloy grown under the same conditions as the sample of FIGS. 5 and 6(a) and have a density of about $4.5 \times 10^9$ cm$^{-2}$, i.e., half that of the sample in FIGS. 5 and 6(a), but the same average diameter. This clearly illustrates that the density of the nanostructures can be controlled by varying the alloy composition. Chemical analysis performed on such samples in a JEOL 2010F high resolution scanning transmission electron microscope using energy dispersive x-ray nano-analysis revealed negligible amounts of Ge in the GaInP matrix material and negligible amounts of Ga, In, and P in the Ge nanostructures respectively.

Figure 7:
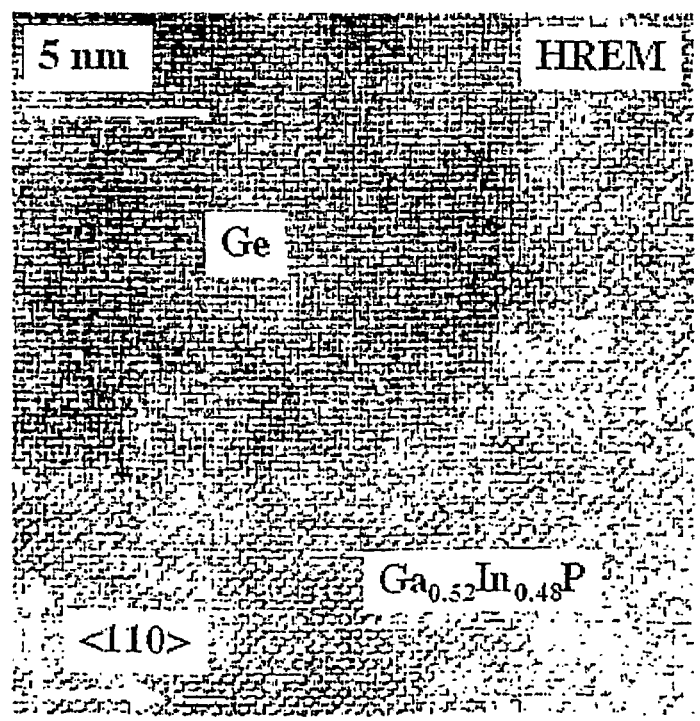
FIG. 7 is a high-resolution electron microscopy (HREM) TEM image showing a plan-view of a Ge nanostructure produced according to an embodiment of the invention.

Since the Ge and $Ga_{0.52}In_{0.48}P$ components are lattice matched, no strain is present between the Ge nanowires and the $Ga_{0.52}In_{0.48}P$ matrix, and hence no defects are present at the nanowire/matrix interfaces that therefore remain coherent as can clearly be seen in the plan-view high resolution TEM lattice image of FIG. 7.

Figure 8A:
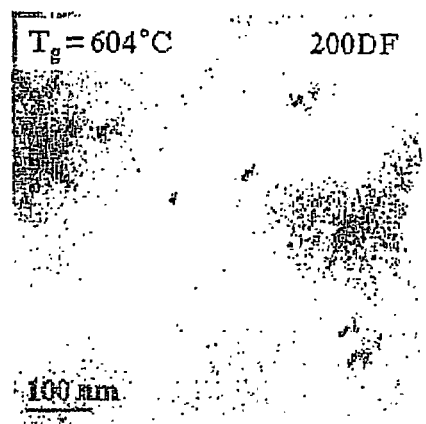
FIG. 8(a) through FIG. 8(c) are 200 DF TEM images showing plan-views of nanostructures produced according to an embodiment of the invention, wherein the temperature was changed to control the size of the nanostructures.
Figure 8B:
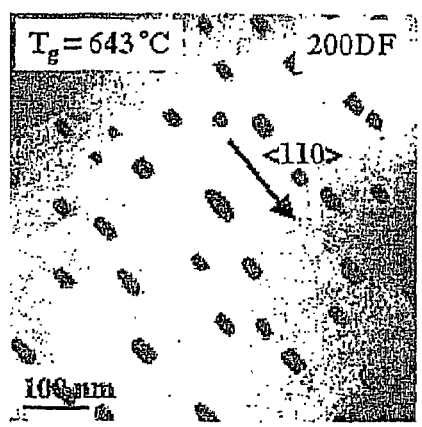
Figure 8C:
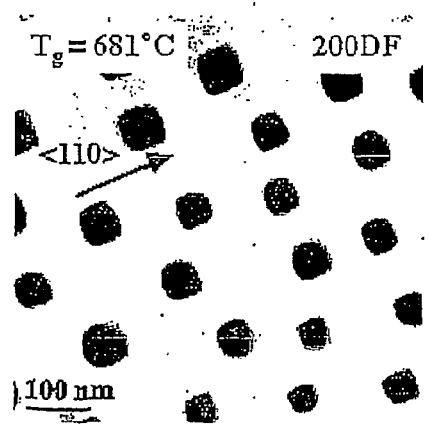

Other examples of nanostructure product produced according to the teachings of the invention are shown in FIG. 8(a) through FIG. 8(c), in which all growth parameters for the $(Ga_{0.52}In_{0.48}P)_{1-x}(Ge_2)_x$ were held constant (V/III ratio ~50, growth rate ~0.08 μm/min, reactor pressure 50 Torr) except for the growth temperature, which was changed to vary the diameter of the nanostructures. That is, lower growth temperatures (e.g., 604° C.) resulted in nanostructures that had an average diameter of less than 10 nm, as best seen in FIG. 8(a). Higher growth temperatures (e.g., 643° C.) resulted in nanostructures that had an average diameter of about 25 nm, as best seen in FIG. 8(b). Yet higher growth temperatures (e.g., 681° C.) resulted in nanostructures that had an average diameter of about 55 nm, as best seen in FIG. 8(c).

Figure 9:
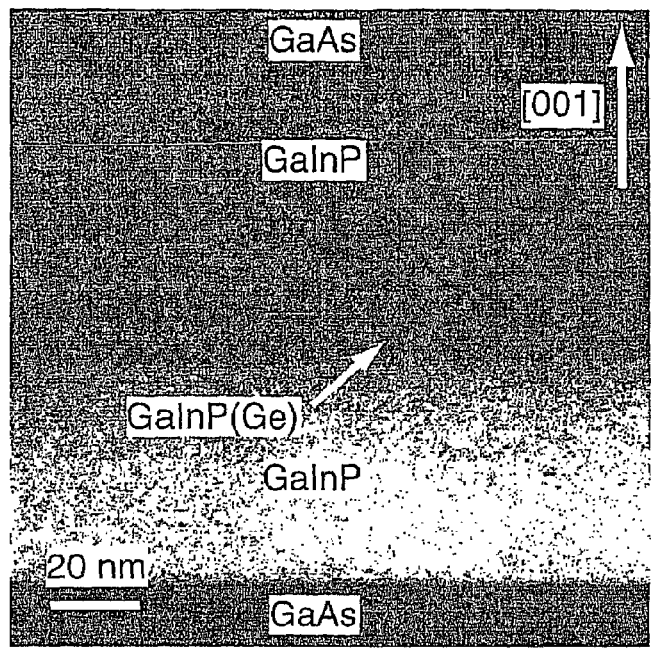
FIG. 9 is a 002 DF TEM image showing a cross-section of nanocrystals produced according to an embodiment of the invention.

As shown in FIG. 9, a $(Ga_{0.52}In_{0.48}P)_{1-x}(Ge_2)_x$ thin layer grown using similar conditions to the previous examples, the nanocrystals appear similar to the nanowires when imaged using TEM, except that the Ge-rich nanostructures are shorter in length than the nanowires shown in FIG. 5. That is, the nanocrystals are preferably less than about 20 nm, whereas the nanowires are preferably longer than about 20 nm, and may even be 1 μm or longer.

Figure 10A:
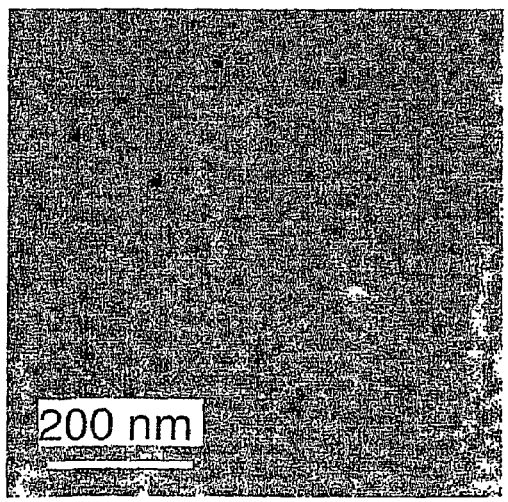
FIG. 10 shows high resolution scanning electron microscopy (SEM) images of nanostructures produced according to embodiments of the invention, wherein (a) is an array of nano-sized holes formed by selective chemical etching to remove the embedded nanostructures and may be used as a template for nanostructure fabrication, and (b) is an array of protruding nanostructures formed by selective chemical etching to remove the matrix.
Figure 10B:
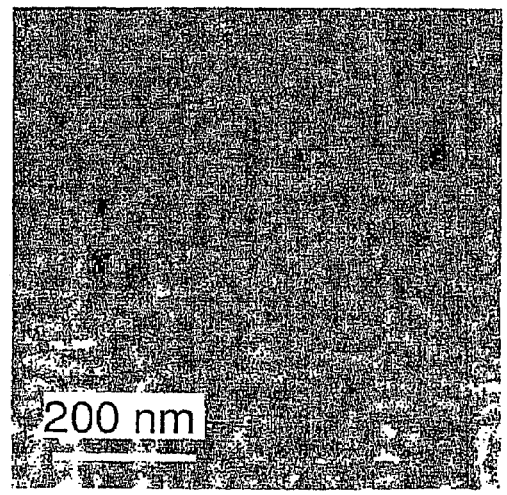

In the following examples selective chemical etching experiments were performed on a 1 μm thick $(Ga_{0.52}In_{0.48}P)_{0.8}(Ge_2)_{0.2}$ nanostructure product layer grown at ~604° C. using a V/III ratio of ~50 and a growth rate of ~0.08 μm/min. In the first example, the $(Ga_{0.52}In_{0.48}P)_{0.8}(Ge_2)_{0.2}$ layer was etched for about 2 minutes in a 1/1/1 volume ratio mixture of concentrated $H_2SO_4/H_2O_2/H_2O$ to selectively etch away the Ge nanowires leaving the $Ga_{0.52}In_{0.48}P$ matrix behind. The result of this procedure is shown in the high-resolution scanning electron microscope image of FIG. 10(a) that shows a close spaced array of nanosized holes (dark contrast areas) in the $Ga_{0.52}In_{0.48}P$ matrix resulting from the selective removal of the Ge nanowires by the chemical etching. Such an array of nanosized holes may be used as a template for the fabrication of other nanostructures as discussed earlier, e.g., by filling the holes with another material. In the second example, the $(Ga_{0.52}In_{0.48}P)_{0.8}(Ge_2)_{0.2}$ layer was etched for about 10 seconds in concentrated HCl to selectively etch away the $Ga_{0.52}In_{0.48}P$ matrix and expose the Ge nanowires. The result of this procedure is shown in FIG. 10(b), a high resolution scanning electron microscope image showing the close spaced array of Ge nanowires (bright contrast regions) protruding from the surface of the remaining $Ga_{0.52}In_{0.48}P$ matrix. Such an array of protruding nanowires may be used, for example, in field emission electron sources for flat panel displays as discussed earlier.

It is readily apparent that the nanostructures produced according to embodiments of the method of the invention exhibit unique properties that make them particularly useful for a number of applications. The process offers a significant degree of control over the properties of the resulting nanostructures. In addition, the process is applicable to a wide range of $(III-V)_{1-x}(IV_2)_x$ alloys, including the potentially very important $(GaP)_{1-x}(Si_2)_x$ and $(InAs)_{1-x}(Si_2)_x$ systems. Accordingly, the process of producing nanostructures according to the present invention is particularly advantageous for various optical, optoelectronic, and microelectronic applications. Consequently, the claimed invention represents an important development in nanostructures and the production thereof.

Having herein set forth preferred embodiments of the present invention, it is anticipated that suitable modifications can be made thereto which will nonetheless remain within the scope of the present invention. Therefore, it is intended that the appended claims be construed to include alternative embodiments of the invention except insofar as limited by the prior art.

What is claimed is:

1. A method of producing nanostructures by phase separation during metal organic vapor-phase epitaxy (MOVPE), comprising:

providing a growth surface in a reaction chamber;

introducing a first mixture of precursor materials into the reaction chamber to form a buffer layer on the growth surface;

introducing a second mixture of precursor materials into the reaction chamber to form an active region on the buffer layer, wherein the nanostructures are embedded in a matrix in the active region; and introducing a third mixture of precursor materials into the reaction chamber to form a cap layer over the active region.

2. The method of claim 1, wherein introducing the third mixture of precursor materials reintroduces the first mixture of precursor materials.

3. The method of claim 1, further comprising doping the first and third mixtures of precursor materials to form a p-type buffer layer and an n-type cap layer.

4. The method of claim 1, further comprising doping the first and third mixtures of precursor materials to form an n-type buffer layer and a p-type cap layer.

5. The method of claim 1, further comprising controlling at least one property of the nanostructures by adjusting at least one of the following parameters: temperature of the growth surface, growth surface material, growth rate of the active region, ratio of the second precursor materials, composition of the second mixture of precursor materials, substrate surface orientation, strain between the active region and the growth surface, and pressure of the reaction chamber.

6. The method of claim 1, further comprising introducing at least one surfactant to control at least one property of the nanostructures.

7. The method of claim 1, further comprising annealing the active region after formation of the nanostructures.

8. The method of claim 1, wherein the first, second, and third mixtures of precursor materials are introduced using at least one carrier gas.

9. The method of claim 8, wherein the flow rate of the carrier gas is adjusted to control at least one property of the nanostructures.

10. The method of claim 8, wherein the type of carrier gas is changed to control at least one property of the nanostructures.

11. A nanostructure product produced according to the method of claim 1.

12. The nanostructure product of claim 11, further comprising an active region characterized by the generic formula (group III-V)$_{1-x}$((group IV)$_2$)$_x$.

13. The nanostructure product of claim 12, wherein group III-V is selected from combinations of:

group III elements consisting of B, Al, Ga, In, and Tl; and
group V elements consisting of N, P, As, Sb, and Bi.

14. The nanostructure product of claim 12, wherein group IV is selected from the group consisting of C, Si, Ge, Sn, and Pb.

15. The nanostructure product of claim 11, further comprising a group IV nanostructure and a group III-V matrix.

16. The nanostructure product of claim 11, further comprising a group III-V nanostructure and a group IV matrix.

17. The nanostructure product of claim 11 characterized as lattice-matched.

18. The nanostructure product of claim 11 characterized as lattice-mismatched.

19. A nanowire produced according to the method of claim 1.

20. The nanowire of claim 19, consisting essentially of at least one group IV element.

21. The nanowire of claim 19, consisting essentially of a group III-V compound.

22. A nanocrystal produced according to the method of claim 1.

23. The nanocrystal of claim 22, consisting essentially of at least one group IV element.

24. The nanocrystal of claim 22, consisting essentially of a group III-V compound.

25. The nanocrystal of claim 22, characterized as having a length of less than about 20 nm.

26. A method of producing a nanostructure by phase separation during metal organic vapor-phase epitaxy (MOVPE), comprising:

providing a growth surface;
forming a buffer layer on the growth surface;
growing an active region having the nanostructure embedded in a matrix on the buffer layer; and
removing a portion of the active region.

27. The method of claim 26, wherein growing the active region comprises providing a mixture of precursor materials in a reaction chamber until the nanostructure grows to a desired size on the buffer layer.

28. The method of claim 26, further comprising phase-separating a group III-V compound from at least one group IV element during growth of the active region.

29. The method of claim 28, wherein the at least one group IV element forms the nanostructure and the group III-V compound forms the matrix in the active region.

30. The method of claim 28, wherein the group III-V compound forms the nanostructure and the at least one group IV element forms the matrix in the active region.

31. The method of claim 26, wherein removing a portion of the active region is by selective etching.

32. The method of claim 26, wherein removing a portion of the active region comprises removing at least a portion of the matrix.

33. A nanostructure product produced according to the method of claim 32.

34. The method of claim 26, wherein removing a portion of the active region comprises removing at least a portion of the nanostructure.

35. A template for fabricating nanostructures produced according to the method of claim 34.

* * * * *